United States Patent
Oi et al.

(10) Patent No.: US 10,068,829 B2
(45) Date of Patent: Sep. 4, 2018

(54) POWER-MODULE SUBSTRATE UNIT AND POWER MODULE

(71) Applicant: MITSUBISHI MATERIALS CORPORATION, Tokyo (JP)

(72) Inventors: Sotaro Oi, Saitama (JP); Tomoya Oohiraki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/306,559

(22) PCT Filed: Apr. 24, 2015

(86) PCT No.: PCT/JP2015/062545
§ 371 (c)(1),
(2) Date: Oct. 25, 2016

(87) PCT Pub. No.: WO2015/163453
PCT Pub. Date: Oct. 29, 2015

(65) Prior Publication Data
US 2017/0053852 A1    Feb. 23, 2017

(30) Foreign Application Priority Data
Apr. 25, 2014 (JP) .................. 2014-092054

(51) Int. Cl.
*H01L 23/373* (2006.01)
*H01L 23/367* (2006.01)
(Continued)

(52) U.S. Cl.
CPC ........ *H01L 23/3736* (2013.01); *C04B 37/026* (2013.01); *H01L 23/3675* (2013.01);
(Continued)

(58) Field of Classification Search
None
See application file for complete search history.

(56) References Cited

U.S. PATENT DOCUMENTS

2004/0240327 A1* 12/2004 Sendur ................... B82Y 10/00
                                                                        369/13.35
2007/0274047 A1* 11/2007 Nagase ............... H01L 23/3735
                                                                        361/704
(Continued)

FOREIGN PATENT DOCUMENTS

JP     2003-168770 A    6/2003
JP     2007-173405 A    7/2007
(Continued)

OTHER PUBLICATIONS

MatWeb (http://www.matweb.com/search/datasheettext.aspx?matguid=38e1c167c7ea4dfebf80778b29ae71cf).*
(Continued)

*Primary Examiner* — Charles Garber
*Assistant Examiner* — Xiaoming Liu
(74) *Attorney, Agent, or Firm* — Locke Lord LLP; James E. Armstrong, IV; Nicholas J. DiCeglie, Jr.

(57) ABSTRACT

A power-module substrate unit having at least one power-module substrate including one ceramic substrate, a circuit layer formed on one surface of the ceramic substrate, and a metal layer formed on another surface of the ceramic substrate, and a heat sink on which the metal layer of the power-module substrate is bonded, in which the metal layer is made of an aluminum plate having purity of 99.99 mass % or higher; the heat sink is made of an aluminum plate having purity of 99.90 mass % or lower; and the circuit layer has a stacking structure of a first layer made of an aluminum plate having the purity of 99.99 mass % or higher and being bonded to the ceramic substrate and a second layer made of (Continued)

the aluminum plate having the purity lower than 99.90 mass % and being bonded on a surface of the first layer.

16 Claims, 8 Drawing Sheets

(51) Int. Cl.
- H05K 1/02 (2006.01)
- H01L 23/00 (2006.01)
- C04B 37/02 (2006.01)
- H01L 23/433 (2006.01)
- H01L 23/473 (2006.01)

(52) U.S. Cl.
CPC ...... *H01L 23/3731* (2013.01); *H01L 23/3735* (2013.01); *H01L 23/4334* (2013.01); *H01L 23/473* (2013.01); *H01L 23/562* (2013.01); *H01L 24/29* (2013.01); *H01L 24/30* (2013.01); *H01L 24/32* (2013.01); *H01L 24/33* (2013.01); *H05K 1/02* (2013.01); *C04B 2237/121* (2013.01); *C04B 2237/402* (2013.01); *C04B 2237/407* (2013.01); *C04B 2237/706* (2013.01); *C04B 2237/86* (2013.01); *H01L 2224/29117* (2013.01); *H01L 2224/32501* (2013.01); *H01L 2924/0002* (2013.01)

(56) References Cited

U.S. PATENT DOCUMENTS

| | | |
|---|---|---|
| 2009/0174063 A1 | 7/2009 | Furukawa et al. |
| 2009/0267215 A1 | 10/2009 | Kitahara et al. |
| 2010/0285331 A1 | 11/2010 | Kitahara et al. |
| 2012/0034128 A1* | 2/2012 | Yamaura ............ C22C 21/02 |
| | | 420/535 |

FOREIGN PATENT DOCUMENTS

| | | | |
|---|---|---|---|
| JP | 2009-065144 A | | 3/2009 |
| JP | 2009065144 A | * | 3/2009 |
| JP | 2009-147316 A | | 7/2009 |
| JP | 2012-191004 A | | 10/2012 |
| WO | 2008/050868 A1 | | 5/2008 |

OTHER PUBLICATIONS

English translation of JP 2009065144.*
International Search Report dated Jul. 7, 2015, issued for PCT/JP2015/062545.

* cited by examiner (a)

(b)

(a)

(b)

(a)

(b)

(a)

(b)

(c)

POWER-MODULE SUBSTRATE UNIT AND POWER MODULE

BACKGROUND OF THE INVENTION

Technical Field

The present invention relates to a power-module substrate unit and a power module used for a semiconductor device controlling large current and high voltage.

Priority is claimed on Japanese Patent Application No. 2014-92054, filed Apr. 25, 2014, the content of which is incorporated herein by reference.

Background Art

For a power module for vehicle, a power-module substrate unit with heat sink constructed by bonding an aluminum plate on a ceramic substrate such as aluminum nitride and bonding an aluminum based heat sink on one surface of the ceramic substrate with an intervening aluminum plate is used.

The power-module substrate unit with heat sink is conventionally produced as below. First, aluminum plates are respectively bonded on both surface of a ceramic substrate by stacking the aluminum plates on both the surfaces of the ceramic substrate with intervening brazing material suitable for bonding the ceramic substrate and the aluminum plates, and heating them up to temperature above a melting point of the brazing material while pressing at a certain pressure. Then, a heat sink and one of the aluminum plates are bonded by stacking the heat sink on the aluminum plate with intervening brazing material suitable for bonding the aluminum plate and the heat sink, and heating them up to temperature above a melting point of the brazing material while pressing at a certain pressure. As a result, the power-module substrate unit with heat sink can be produced.

In this power-module substrate unit with heat sink, one of the aluminum plates is formed as a circuit layer on which semiconductor elements such as power devices and the like are mounted by solder material.

In this power-module substrate, a warp of the substrate should be small since heat radiation performance or the like is deteriorated by the warp.

Conventionally, there are approaches to reduce the warp or the like of the power-module substrate, as described in Patent Document 1 and Patent Document 2 for example.

A power module substrate described in Patent Document 1 uses a clad material for a metal plate as a circuit layer, formed by stacking two or more layers including a first layer of aluminum purity of 99.0 mass % or higher and 99.95 mass % or lower and a second layer of aluminum purity of 99.99 mass % or higher. The second layer is bonded to the ceramic substrate. It is described that in this case, a thickness of the circuit layer is 600 μm and a thickness of a metal layer provided on an opposite surface to the circuit layer of the ceramic substrate is 400 μm.

In Patent Document 2, a silicon nitride circuit substrate in which a metal clad material is bonded to at least one surface of a silicon nitride substrate is disclosed. As the metal clad material, it is described that a combination of conductive material such as a Cu plate, an A1 plate or the like and low thermal expansion metal such as a kovar plate, a tungsten plate or the like is appropriate.

CITATION LIST

Patent Document 1: Japanese Unexamined Patent Application, First Publication No. 2012-191004

Patent Document 2: Japanese Unexamined Patent Application, First Publication No. 2003-168770

SUMMARY OF INVENTION

Technical Problem

In the conventional power-module substrate unit with heat sink, mainly, it is a subject to reduce a primary warp resulting from difference of linear expansion between an insulate substrate and a heat sink when bonding the heat sink. However, a warp may be generated by temperature fluctuation after bonding the heat sink, in a heating process of mounting semiconductor elements or in a usage environment.

If the warp is generated in the mounting process, there is a subject of deterioration of bonding reliability since a position of a solder bonding part may be shifted or distortion and cracks may be generated at the solder bonding part. If the warp is generated in the usage environment, thermal conductive grease between the heat sink and a cooler may flow out by a pump-out phenomenon, so that adhesion of the heat sink and the cooler may be deteriorated, as a result, thermal resistance may be increased.

The present invention is achieved in consideration of the above circumstances, and has an object to provide a power-module substrate unit with heat sink and a power module in which a warp is small not only after bonding a heat sink but also in a mounting process of semiconductor elements or in an usage environment.

Solution to Problem

A power-module substrate unit of the present invention having at least one power-module substrate including one ceramic substrate, a circuit layer formed on one surface of the ceramic substrate, and a metal layer formed on another surface of the ceramic substrate, and a heat sink on which the metal layer of the power-module substrate is bonded, the power-module substrate unit in which the metal layer is made of an aluminum plate having purity of 99.99 mass % or higher; the heat sink is formed from an aluminum plate having purity of 99.90 mass % or lower; and the circuit layer has a stacking structure of a first layer made of an aluminum plate having purity of 99.99 mass % or higher and being bonded to the ceramic substrate; and a second layer made of an aluminum plate having purity lower than 99.90 mass % and being bonded on a surface of the first layer.

Since the circuit layer has a stacked structure of the first and second layers, and the second layer made of the aluminum plate having high rigidity is arranged on the ceramic substrate of an opposite side to the heat sink having high rigidity, i.e., high yield stress, accordingly, the heat sink and the second layer of the circuit layer are arranged symmetrically about the ceramic substrate. As a result, a warp is hardly generated because internal stresses act on both surfaces of the ceramic substrate by heating are balanced. As the first layer bonded to the ceramic substrate, the aluminum plate having purity of 99.99 mass % or higher, which is comparatively soft, i.e., having low yield stress, is arranged; accordingly, cracks can be prevented by reducing thermal stress which acts on the ceramic substrate by heating. Moreover, in a case in which the second layer is made of an aluminum plate with high yield stress having purity lower than 99.90 mass %, a thickness of the second layer can be small, so that a structure can be more desirable since the thermal resistance is not increased.

In the power-module substrate unit of the present invention, it is preferable that a ratio $(t1 \times A1 \times \sigma 1)/(t2 \times A2 \times \sigma 2)$ be 0.85 or larger and 1.40 or smaller: where t1 (mm) is a thickness of the second layer; A1 (mm$^2$) is a bonding area of the second layer; $\sigma 1$ (N/mm$^2$) is a yield stress of the second layer; t2 (mm) is a thickness of the heat sink; A2 (mm$^2$) is a bonding area of the heat sink; and $\sigma 2$ (N/mm$^2$) is a yield stress of the heat sink.

For the second layer of the circuit layer and the heat sink, by setting relation between the thicknesses, the bonding areas and the yield stresses to these ranges, it is possible to improve symmetry around the ceramic substrate, so the warp can be reliably prevented. That is to say, in a case in which the circuit layer is constructed as a pattern by arranging a plurality of small-circuit layers on the ceramic substrate of the power-module substrate unit, the warp can be reliably prevented by considering the symmetry between rigidity of the second layer and rigidity of the heat sink 20 at the bonding parts, though outlines are different between the bonding part of the circuit layer which is bonded to the ceramic substrate and the bonding part of the heat sink to which the metal layer is bonded.

In the power-module substrate unit of the present invention, the circuit layer may further include a circuit-side bonding core made of an aluminum alloy plate between the first layer and the second layer: and a ratio $(t1 \times A1 \times \sigma 1 + t3 \times A3 \times \sigma 3)/(t2 \times A2 \times \sigma 2)$ may be 0.85 or larger and 1.40 or smaller: where t1 (mm) is a thickness of the second layer; A1 (mm$^2$) is a bonding area of the second layer; $\sigma 1$ (N/mm$^2$) is a yield stress of the second layer; t2 (mm) is a thickness of the heat sink; A2 (mm$^2$) is a bonding area of the heat sink; $\sigma 2$ (N/mm$^2$) is a yield stress of the heat sink; t3 (mm) is a thickness of the circuit-side bonding core; A3 (mm$^2$) is a bonding area of the circuit-side bonding core and the first layer; and $\sigma 3$ (N/mm$^2$) a yield stress of the circuit-side bonding core.

The power-module substrate unit of the present invention further may include a heat-radiation-side bonding core made of an aluminum alloy plate between the metal layer and the heat sink, and a ratio $(t1 \times A1 \times \sigma 1)/(t2 \times A2 \times \sigma 2 + t4 \times A4 \times \sigma 4)$ is 0.85 or larger and 1.40 or smaller, where t1 (mm) is a thickness of the second layer; A1 (mm$^2$) is a bonding area of the second layer; $\sigma 1$ (N/mm$^2$) is a yield stress of the second layer; t2 (mm) is a thickness of the heat sink; A2 (mm$^2$) is a bonding area of the heat sink; $\sigma 2$ (N/mm$^2$) is a yield stress of the heat sink; t4 (mm) is a thickness of the heat-radiation-side bonding core; A4 (mm$^2$) is a bonding area of the heat-radiation-side bonding core and the metal layer; and $\sigma 4$ (N/mm$^2$) is a yield stress of the heat-radiation-side bonding core.

In the power-module substrate unit of the present invention, the circuit layer may further include a circuit-side bonding core made of an aluminum alloy plate between the first layer and the second layer, and a heat-radiation-side bonding core made of an aluminum alloy plate between the metal layer and the heat sink, and a ratio $(t1 \times A1 \times \sigma 1 + t3 \times A3 \times \sigma 3)/(t2 \times A2 \times \sigma 2 + t4 \times A4 \times \sigma 4)$ may be 0.85 or larger and 1.40 or smaller, where: t1 (mm) is a thickness of the second layer; A1 (mm$^2$) is a bonding area of the second layer; $\sigma 1$ (N/mm$^2$) is a yield stress of the second layer; t2 (mm) is a thickness of the heat sink; A2 (mm$^2$) is a bonding area of the heat sink; $\sigma 2$ (N/mm$^2$) is a yield stress of the heat sink; t3 (mm) is a thickness of the circuit-side bonding core; A3 (mm$^2$) is a bonding area of the circuit-side bonding core and the first layer; $\sigma 3$ (N/mm$^2$) is a yield stress of the circuit-side bonding core; t4 (mm) is a thickness of the heat-radiation-side bonding core; A4 (mm$^2$) is a bonding area of the heat-radiation-side bonding core and the metal layer; and $\sigma 4$ (N/mm$^2$) is a yield stress of the heat-radiation-side bonding core.

In the power-module substrate unit of the present invention, the circuit layer of the power module substrate may be formed of a plurality of small-circuit layers which are separated from each other.

The power-module substrate unit of the present invention may include a plurality of the power-module substrates.

A power module of the present invention includes the power-module substrate unit and a semiconductor element mounted on a surface of the circuit layer.

Advantageous Effects of Invention

According to the present invention, by reducing the warp caused by heating, it is possible to resolve the problem in the processes to mount the semiconductor elements by soldering or the like, and reliability of an insulate substrate is improved since the warp by a temperature cycle is reduced. Moreover, deformation of the circuit layer is reduced by using a high-rigid member for the circuit layer, and contact reliability of the semiconductor element is also good.

DESCRIPTION OF EMBODIMENTS

Figure 1:
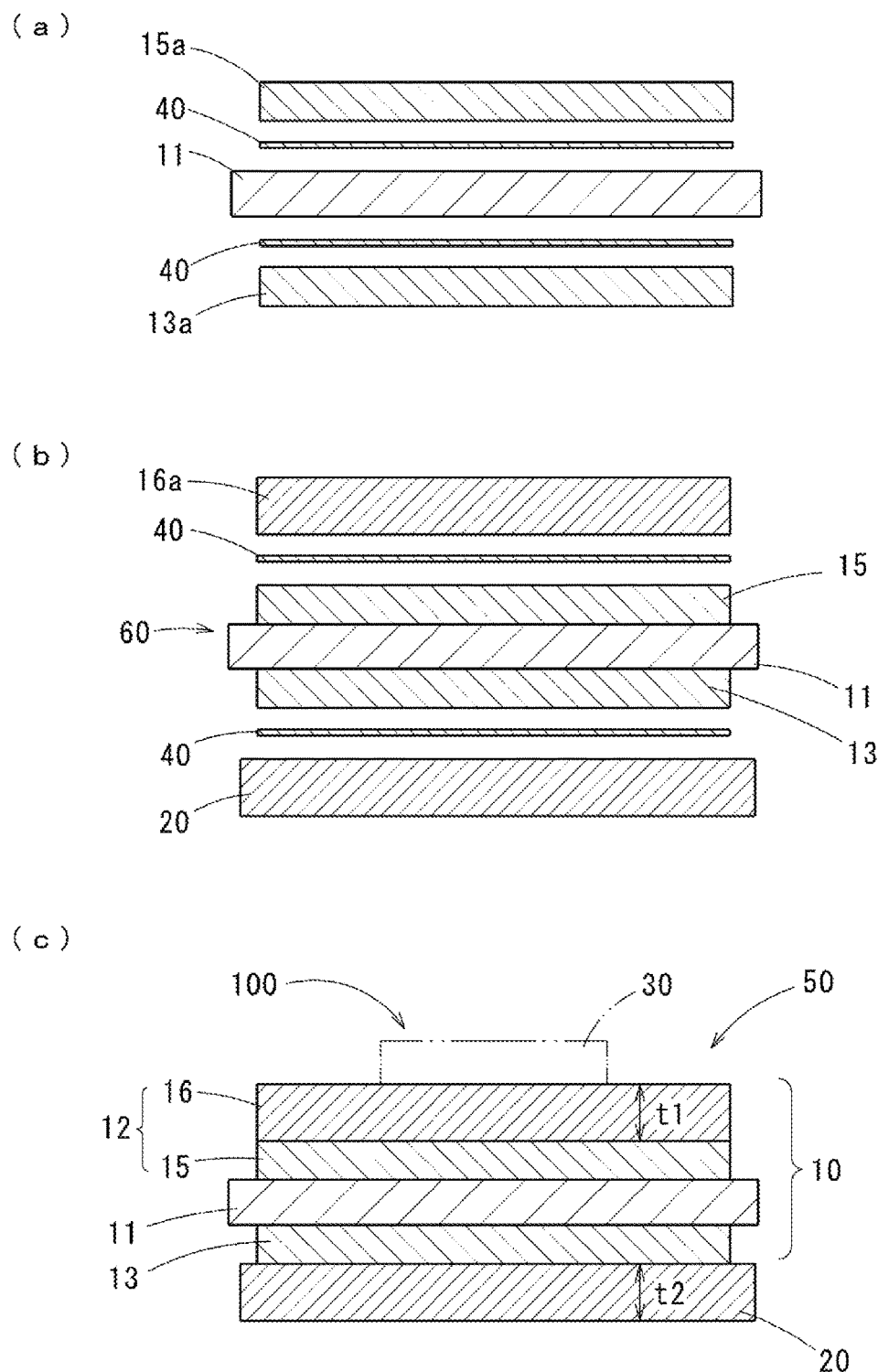
FIG. 1 is a sectional view showing a manufacturing process of a power-module substrate unit according to a first embodiment of the present invention.

Below, embodiments of the present invention will be explained referring drawings. A power-module substrate unit 50 of a first embodiment shown in a part (c) of FIG. 1 is provided with a power-module substrate 10 and a heat sink 20. A power module 100 is manufactured by mounting a semiconductor element 30 such as a semiconductor chip and the like on a surface of the power-module substrate unit 50.

The power-module substrate 10 is provided with a ceramic substrate 11, a circuit layer 12 bonded on one surface of the ceramic substrate 11 by soldering, and a metal layer 13 bonded on another surface of the ceramic substrate 11 by soldering. Regarding this power-module substrate 10, the semiconductor element 30 is soldered on a surface of the circuit layer 12, and the heat sink 20 is brazed on a surface of the metal layer 13.

The ceramic substrate 11 can be made of, for example, nitride-ceramics such as AlN (aluminum nitride), $Si_3N_4$ (silicon nitride) or the like, or oxide-ceramics such as $Al_2O_3$ (alumina) or the like. Thickness of the ceramic substrate 11 can be set in a range of 0.2 to 1.5 mm.

The circuit layer 12 has a stacking structure of a first layer 15 bonded on the surface of the ceramic substrate 11, and a second layer 16 bonded on the first layer 15. The first layer 15 is made of an aluminum plate having purity of 99.99 mass % or higher (i.e., a pure aluminum plate of 1N99 of the JIS standard: so-called a 4N aluminum). The second layer 16 is made of an aluminum plate having purity lower than 99.90 mass % (i.e., a pure aluminum plate having purity of 99.0 mass % or higher, so-called 2N aluminum of the JIS standard (e.g., A1050 or the like), or an aluminum alloy plate such as A3003, A6063, A5052 or the like of the JIS standard. Thickness of the first layer 15 is 0.1 mm or more and 2.5 mm or less, and thickness t1 of the second layer 16 is 0.5 mm or more and 5.0 mm or less.

The metal layer 13 is made of an aluminum plate having purity of 99.99 mass % or higher (1N99 of the JIS standard (purity of 99.99 mass % or higher: so-called 4N aluminum), and formed to have thickness of 0.1 mm or more and less than 2.5 mm, similar to the first layer 15 of the circuit layer 12.

As material of the heat sink 20 bonded to the power-module substrate 10, an aluminum plate having purity of 99.90 mass % or lower such as 1N90 of the JIS standard (purity of 99.90 mass % or higher, so-called 3N aluminum) or so-called 2N aluminum having purity of 99.0 mass % or higher (e.g., A1050 or the like), or an aluminum alloy plate such as A3003, A6063, A5052 or the like can be used.

As the heat sink 20, such as a shape of plane plate, a shape of multi-pin fin integrally formed by hot forging or the like, a shape of fin integrally formed by extrusion molding to have belt fin which are parallel to each other or the like, an appropriate one can be used. The heat sink 20 is assembled as a part of a cooler in which coolant is circulated, to the other parts of the cooler by screws or the like. Especially, it is preferable to use the flat plate in which efficient of reducing the warp is large or the one integrally formed with multi-pin fin as the heat sink 20. In this embodiment, the heat sink 20 has a flat plate shape.

The heat sink 20 and the second layer 16 of the circuit layer 12 are set to have a ratio of $(t1 \times A1 \times \sigma1)/(t2 \times A2 \times \sigma2)$ in 0.85 or larger and 1.40 or smaller where t1 is the thickness of the second layer 16, A1 is a bonding area of the second layer 16 to the first layer 15, $\sigma1$ is an yield stress of the second layer 16, t2 is a thickness of the heat sink 20, A2 is a bonding area of the metal layer 13 to the heat sink 20, and $\sigma2$ is an yield stress of the heat sink 20.

For example, in a case in which the second layer 16 is aluminum alloy of A5003 (the yield stress $\sigma1=40$ N/mm$^2$) having the thickness t1=1.5 mm, the bonding area A1 of the first layer 15 and the second layer 16 is 900 mm$^2$, the heat sink 20 is made of aluminum alloy of A6063 (the yield stress $\sigma2=50$ N/mm$^2$) having the thickness t2=1.0 mm, and the bonding area A2 of the metal layer 13 and the heat sink 20 is 1000 mm$^2$, the ratio of $(t1 \times A1 \times \sigma1)/(t2 \times A2 \times \sigma2)=1.08$. The values of the yield stress in the present invention are values at room temperature (25° C.).

Next, a method for manufacturing the power-module substrate unit 50 constructed as above will be explained. The power-module substrate unit 50 is manufactured by bonding the first layer 15 of the circuit layer 12 and the metal layer 13 to the ceramic substrate 11 (a first bonding process), and then bonding the second layer 16 on the first layer 15 and the heat sink 20 on the metal layer 13 (a second bonding process). Below, the processes will be explained in order.

<First Bonding Process>

First, as shown by a part (a) of FIG. 1, stacking a first-layer aluminum plate 15a to be the first layer 15 of the circuit layer 12 on one surface of the ceramic substrate 11, and stacking a metal-layer aluminum plate 13a to be the metal layer 13 on another surface of the ceramic substrate 11, these members are bonded together. For bonding these members, brazing material 40 of Al—Si based alloy or the like is used. It is preferable that the brazing material 40 be a form of a foil.

Figure 2:
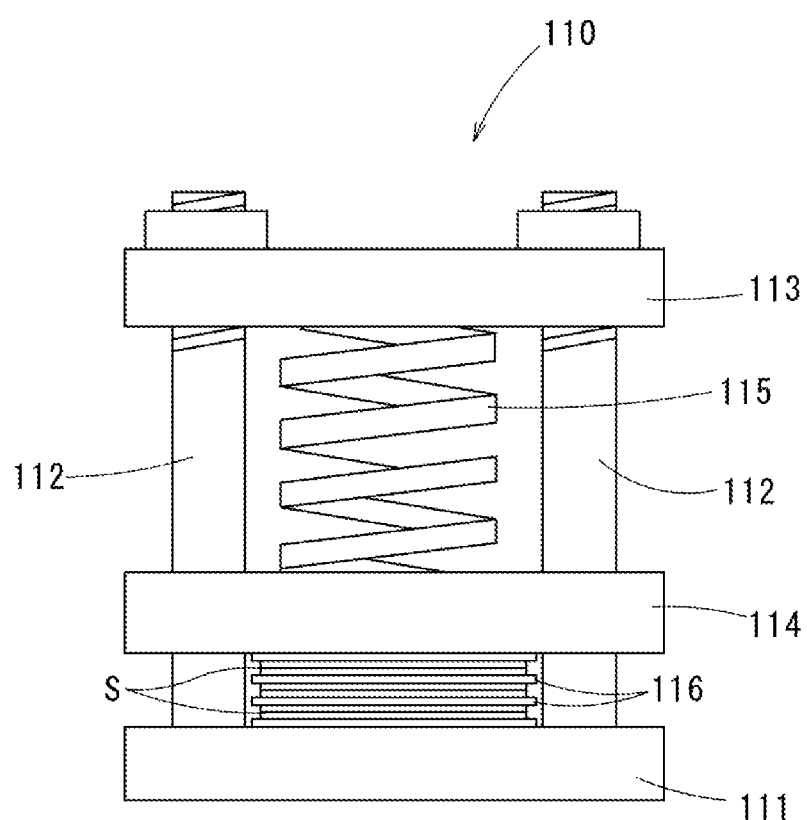
FIG. 2 is a front view of a pressing device used for manufacturing the power-module substrate unit according to the first embodiment of the present invention.

As shown by the part (a) of FIG. 1, the ceramic substrate 11, the first-layer aluminum plate 15a and the metal-layer aluminum plate 13a are stacked with the brazing materials 40 therebetween so as to be a stacked body S. The stacked bodies S are pressed in a stacking direction by a pressing device 110 as shown in FIG. 2.

The pressing device 110 is provided with a base plate 111, guide posts 112 vertically fixed to four corners of an upper surface of the base plate 111, a fixed plate 113 fixed to upper ends of the guiding posts 112, a pressing plate 114 held by the guiding posts 112 between the base plate 111 and the fixed plate 113 so as to move vertically, and a pressing means 115 such as a spring between the fixed plate 113 and the pressing plate 114 so as to press the pressing plate 114 downward.

The fixed plate 113 and the pressing plate 114 are arranged parallel to the base plate 111. The stacked bodies S are disposed between the base plate 111 and the pressing plate 114. Carbon sheets 116 are disposed at both sides of the stacked bodies S in order to average pressing force.

Brazing is performed by heating up to brazing temperature under vacuum atmosphere by the pressing device 110 in a heating furnace (not illustrated) in a pressed state by the pressing device 110. In this circumstance, the pressing force is set to 0.68 MPa (7 kgFcm$^2$) and heating temperature is set to 640° C., for example.

<Second Bonding Process>

As shown in a part (b) of FIG. 1, on the first layer 15 of the circuit layer 12 in a bonded body 60 obtained by the first bonding process, a second-layer aluminum plate 16a to be the second layer 16 with the brazing material 40 therebetween is stacked, and the heat sink 20 is stacked on the metal layer 13 with the brazing material 40 therebetween. These brazing materials 40 are used as foils of brazing material of Al—Si based alloy or the like.

Then, stacked bodies of these are pressed in a stacking direction by the pressing device 110 as in FIG. 2, and heated under vacuum atmosphere as it is together with the pressing device 110 so that the second layer 16 and the heat sink 20 are brazed. In this circumstance, pressing force is set to 0.68 MPa (7 kgf/cm$^2$) and heating temperature is set to 615° C., for example.

On the power-module substrate unit 50 manufactured as above, the semiconductor element 30 is bonded by soldering at an upper surface of the circuit layer 12 (the second layer 16) as shown in the part (c) of FIG. 1, so that the power module 100 is manufactured.

In the power module 100 manufactured as above, the power-module substrate unit 50 has the circuit layer 12 as a stacking structure of the first layer 15 and the second layer 16, so that the second layer 16 formed from the second-layer aluminum plate 16a having high rigidity is arranged at an opposite side to the ceramic substrate 11 with respect to the heat sink 20 having high rigidity, i.e., having high yield stress, so that the heat sink 20 and the second layer 16 of the circuit layer 12 are symmetrically arranged about the ceramic plate 11. Accordingly, internal stresses act on both surfaces of the ceramic substrate 11 by heating are balanced, and a warp is hardly generated. Furthermore, since the first-layer aluminum plate 15a, which is comparatively soft and has purity of 99.99 mass % or higher, i.e., has low yield stress, is arranged as the first layer 15 bonded to the ceramic substrate 11, thermal stress on the ceramic substrate 11 when it is heated can be reduced, so that breakage can be prevented. Moreover, if the second layer 16 is made of an aluminum plate having purity lower than 99.90 mass % with high yield stress, thickness of the second layer 16 can be decreased, so that it is a more preferable structure since the thermal resistance is not increased.

In the power-module substrate unit 50, the ratio $(t1 \times A1 \times \sigma1)/(t2 \times A2 \times \sigma2)$ is set to 0.85 or larger and 1.40 or smaller, where t1 is the thickness of the second layer 16 of the circuit layer 12, A1 is the bonding area of the first layer 15 and the second layer 16, $\sigma1$ is the yield stress of the second layer 16, t2 is the thickness of the heat sink 20, A2 is the bonding area of the metal layer 13 and the heat sink 20, and $\sigma2$ is the yield stress of the heat sink 20. As a result, the warp caused from temperature fluctuation in the mounting process of the semiconductor element 30 and or in the usage environment after that is hardly generated, so the power-module substrate unit 50 has long term high reliability as a insulate substrate.

In the power-module substrate unit 50, in the cases in which the ratio $(t1 \times A1 \times \sigma1)/(t2 \times A2 \times \sigma2)$ is 1.00, 0.85 or larger and smaller than 1.00, or larger than 1.00 and 1.40 or smaller, a good symmetry structure about the ceramic substrate 11 can be obtained. In the power-module substrate unit 50, deformation of the circuit layer 12 can be prevented since the second layer 16 on which the semiconductor element 30 is soldered is made of an aluminum plate with high rigidity, i.e., high yield stress.

For soldering the semiconductor element 30, Sn—Sb based, Sn—Ag based, Sn—Cu based, Sn—In based or Sn—Ag—Cu based soldering material is used, and it is performed by heating to 275° C. to 335 ° C., for example.

In the above first embodiment, the brazing material of Al—Si based alloy is used for brazing in vacuum atmosphere. Moreover, Al—Si—Mg based, Al—Mg based, Al—Ge based, Al—Cu based, or Al—Mn based brazing material can be used. In a case in which brazing material of Al—Si—Mg based alloy or Al—Mg based alloy including Mg is used for brazing, it can be performed in non-oxidation atmosphere.

Figure 3:
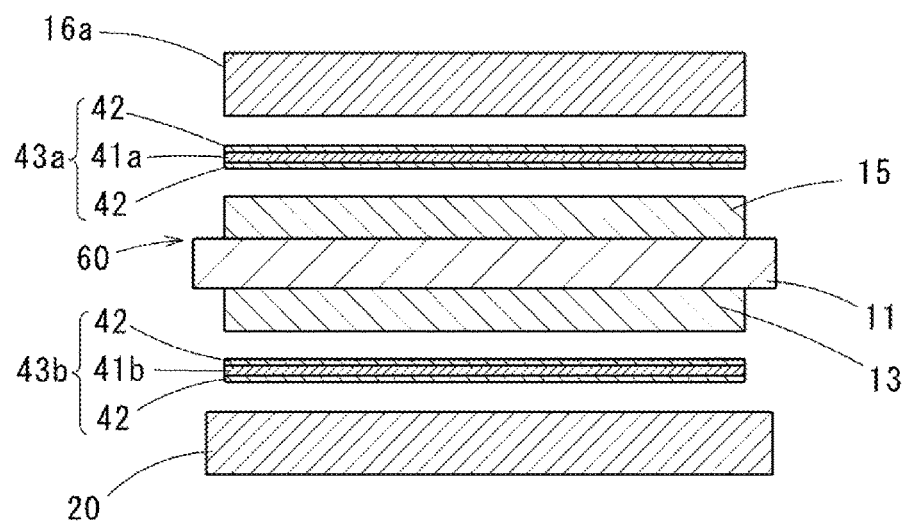
FIG. 3 is a sectional view showing a manufacturing process of a power-module substrate unit according to a second embodiment of the present invention.
Figure 3:
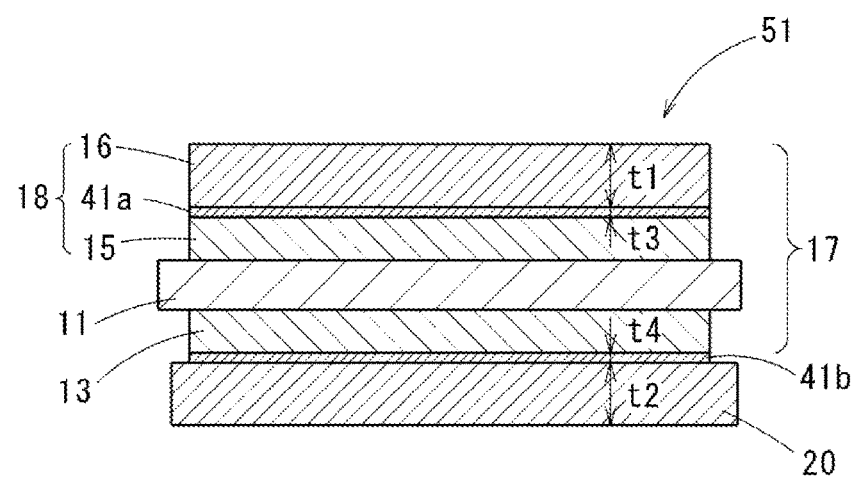

FIG. 3 shows a manufacturing method of a power-module substrate unit 51 of a second embodiment. In this embodiment, same reference symbols are denoted on same elements as in the first embodiment shown in FIG. 1. (It is the same in embodiments mentioned below.)

In the power-module substrate unit 51, a double-side clad brazing material 43a in which brazing material layers 42 are formed on both surface of a circuit-side bonding core 41a bonds the first layer 15 and the second layer 16 of a circuit layer 18 in a power-module substrate 17. The metal layer 13 and the heat sink 20 are bonded by a double-side clad brazing material 43b in which brazing material layers 42 are formed on both surface of a heat-radiation-side bonding core 41b.

In the double-side clad brazing materials 43a and 43b, the circuit-side bonding core 41a and the heat-radiation-side bonding core 41b are made of A3003 aluminum alloy by the JIS standard having thickness of 0.05 mm to 0.6 mm, and the brazing material layers 42 at both sides are made of Al—Si—Mg based alloy.

The manufacturing method of the power-module substrate unit 51 of the second embodiment will be explained. First, similar to the first bonding process of the first embodiment, a first bonding process by brazing is performed using the brazing material 40, by bonding the first layer 15 of the circuit layer 18 to one surface of the ceramic substrate 11, and bonding the metal layer 13 to another surface of the ceramic substrate 11 (refer to the part (a) of FIG. 1). After that, as shown in a part (a) of FIG. 3, stacking the second-layer aluminum plate 16a to be the second layer 16 on the first layer 15 with the double-side clad brazing material 43a therebetween, and stacking the heat sink 20 on the metal layer 13 with the double-side clad brazing material 43b therebetween, and these members are brazed by pressing in the stacking direction and heating in non-oxidation atmosphere such as nitrogen atmosphere.

In the power-module substrate unit 51 of the second embodiment manufactured as above, as shown in a part (b) of FIG. 3, a thin aluminum alloy layer (the circuit-side bonding core 41a) is arranged between the first layer 15 and the second layer 16 of the circuit layer 18, and a thin aluminum alloy layer (the heat-radiation-side bonding core 41b) is arranged between the metal layer 13 and the heat sink 20.

In the power-module substrate unit 51, a ratio $(t1 \times A1 \times \sigma1 + t3 \times A3 \times \sigma3)/(t2 \times A2 \times \sigma2 + t4 \times A4 \times \sigma4)$ is 0.85 or larger and 1.40 or smaller, where t1 is a thickness of the second layer 16 in the circuit layer 18, A1 is a bonding area of the second layer 16 to the circuit-side bonding core 41a, $\sigma1$ is a yield stress of the second layer 16, t2 is a thickness of the heat sink 20, A2 is a bonding area of the heat sink 20 to the heat-radiation-side bonding core 41b, $\sigma2$ is a yield stress of the heat sink 20, t3 is a thickness of the circuit-side bonding core 41a, A3 a bonding area of the circuit-side bonding core 41a and the first layer 15, $\sigma3$ is a yield stress of the circuit-side bonding core 41a, t4 is a thickness of the heat-radiation-side bonding core 41b, A4 is a bonding area of the heat-radiation-side bonding core 41b and the metal layer 13, and $\sigma4$ is a yield stress of the heat-radiation-side bonding core 41b.

In the power-module substrate unit 51, as described above, when the ratio $(t1 \times A1 \times \sigma1 + t3 \times A3 \times \sigma3)/(t2 \times A2 \times \sigma2 + t4 \times A4 \times \sigma4)$ is 1.00, 0.85 or larger and smaller than 1.00, or larger than 1.00 and 1.40 or smaller, a good symmetry structure about the ceramic substrate 11 can be obtained as in the first embodiment.

Figure 4:
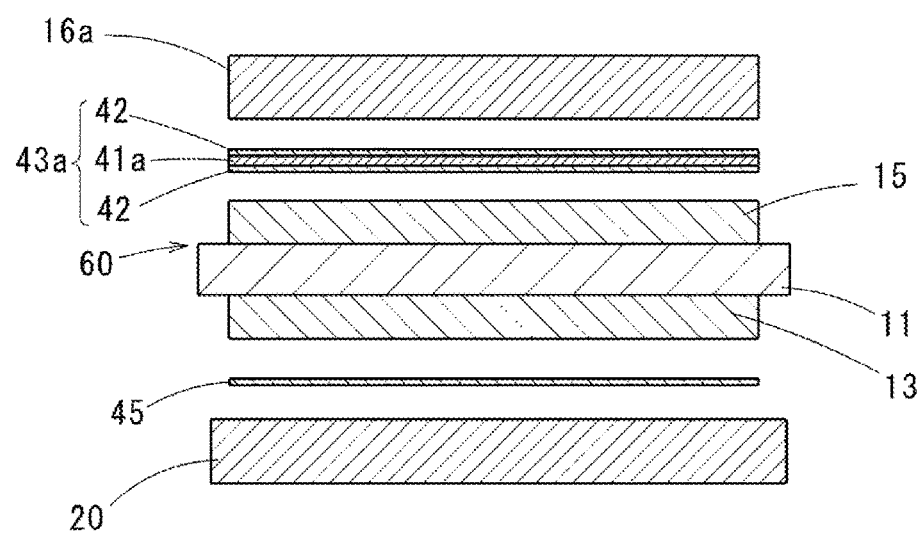
FIG. 4 is a sectional view showing a manufacturing process of a power-module substrate unit according to a third embodiment of the present invention.
Figure 4:
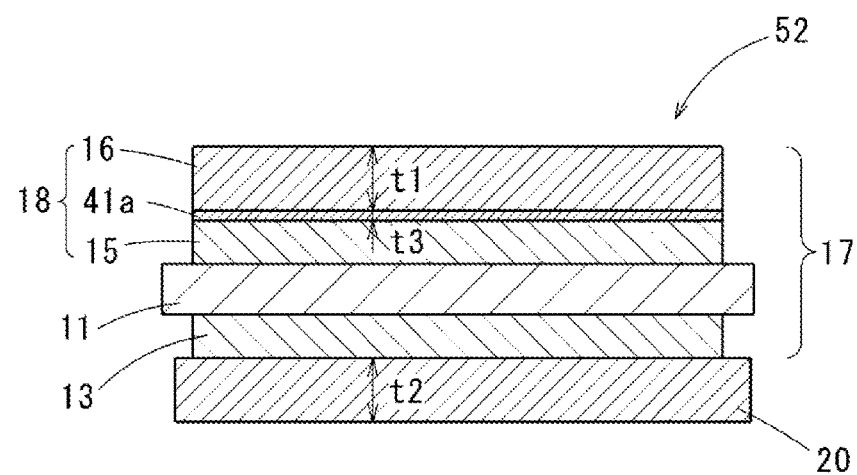

FIG. 4 shows a manufacturing method of a power-module substrate unit 52 of a third embodiment. In the power-module substrate unit 52, the circuit layer 18 is formed as the second embodiment, so that the first layer 15 and the second layer 16 are bonded by the double-side clad brazing material 43a in which the brazing material layers 42 are formed on both surfaces of the circuit-side bonding core 41a. The metal layer 13 and the heat sink 20 are bonded by brazing material 45 of Al—Si based alloy as the first embodiment.

The manufacturing method of the power-module substrate unit 52 of the third embodiment will be explained. First, similar to the first bonding process of the first embodiment, a first bonding process is performed by brazing of bonding the first layer 15 of the circuit layer 18 to one surface of the ceramic substrate 11 and bonding the metal layer 13 to another surface of the ceramic substrate 11 (refer to the part (a) of FIG. 1) using the brazing material 40. After that, as shown in a part (a) of FIG. 4, stacking the second-layer aluminum plate 16a to be the second layer 16 on the first layer 15 with the double-side clad brazing material 43a therebetween, and stacking the heat sink 20 on the metal layer 13 with the brazing material 45 made of Al—Si—Mg based alloy, and these members are brazed by pressing in the stacking direction and heating in non-oxidation atmosphere such as nitrogen-atmosphere.

In this power-module substrate unit 52, as shown in a part (b) of FIG. 4, a thin aluminum alloy layer (the circuit-side bonding core 41a of the double-side clad brazing material 43a) is arranged between the first layer 15 and the second layer 16 of the circuit layer 18.

In this power-module substrate unit 52, a ratio $(t1 \times A1 \times \sigma1 + t3 \times A3 \times \sigma3)/(t2 \times A2 \times \sigma2)$ is 0.85 or larger and 1.40 or smaller where t1 is a thickness of the second layer 16 of the circuit layer 18, A1 is a bonding area of the second layer 16 to the circuit-side bonding core 41a, σ1 is a yield stress of the second layer 16, t2 is a thickness of the heat sink 20, A2 is a bonding area of the metal layer 13 and the heat sink 20, σ2 is a yield stress of the heat sink 20, t3 is a thickness of the circuit-side bonding core 41a, A3 is a bonding area of the circuit-side bonding core 41a and the first layer 15, and σ3 a yield stress of the circuit-side bonding core 41a.

In the power-module substrate unit 52, as described above, in cases in which the ratio $(t1 \times A1 \times \sigma1 + t3 \times A3 \times \sigma3)/(t2 \times A2 \times \sigma2)$ is 1.00, 0.85 or larger and smaller than 1.00, or larger than 1.00 and 1.40 or smaller, a good symmetry structure about the ceramic substrate 11 can be obtained as in the first embodiment.

Figure 5:
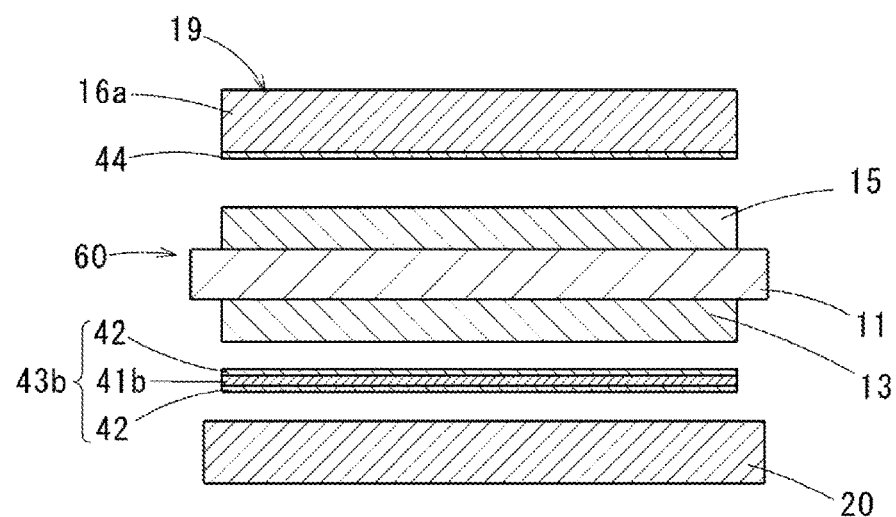
FIG. 5 is a sectional view showing a manufacturing process of a power-module substrate unit according to a fourth embodiment of the present invention.
Figure 5:
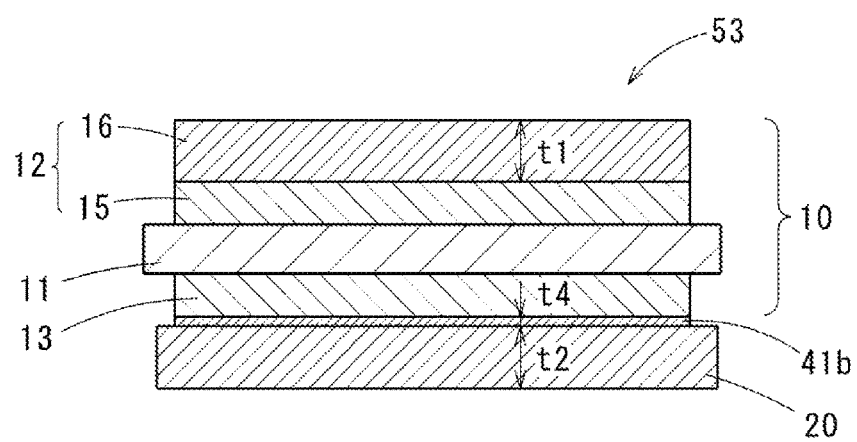

FIG. 5 shows a manufacturing method of a power-module substrate unit 53 of a fourth embodiment. In the power-module substrate unit 53, the second layer 16 of the circuit layer 12 is made by bonding a clad plate 19 in which a brazing material layer 44 made of Al—Si—Mg based alloy is stacked on one surface of the second-layer aluminum plate 16a. First, (1) the first layer 15 of the circuit layer 12 is brazed on one surface of the ceramic substrate 11 and the metal layer 13 is brazed on another surface of the ceramic substrate 11 as in the first bonding process of the first embodiment, then the clad plate 19 is stacked laying the brazing material layer 44 over the first layer 15 as shown in a part (a) of FIG. 5, the heat sink 20 is stacked on the metal layer 13 with the double-side clad brazing material 43b (which is constructed by forming the brazing material layers 42 on both the surfaces of the heat-radiation-side bonding core 41b and used in the second embodiment) therebetween, these members are pressed in the stacking direction and heated in non-oxidation atmosphere such as nitrogen atmosphere so as to be brazed.

In the power-module substrate unit 53 shown in a part (b) of FIG. 5, a ratio $(t1 \times A1 \times \sigma1)/(t2 \times A2 \times \sigma2 + t4 \times A4 \times \sigma4)$ is 0.85 or larger and 1.40 or smaller where t1 is a thickness of an aluminum plate of the second layer 16 of the circuit layer 12, A1 is a bonding area of the second layer 16 and the first layer 15, σ1 is a yield stress of the second layer 16, t2 is a thickness of the heat sink 20, A2 is a bonding area of the heat sink 20 and the heat-radiation-side bonding core 41b, σ2 is a yield stress of the heat sink 20, t4 is a thickness of the heat-radiation-side bonding core 41b, A4 is a bonding area of the heat-radiation-side bonding core 41b and the metal layer 13, and σ4 is a yield stress of the heat-radiation-side bonding core 41b.

In this power-module substrate unit 53, as described above, in cases in which the ratio $(t1 \times A1 \times \sigma1)/(t2 \times A2 \times \sigma2 + t4 \times A4 \times \sigma4)$ is 1.00, 0.85 or larger and smaller than 1.00, or larger than 1.00 and 1.40 or smaller, a good symmetry structure about the ceramic substrate 11 can be obtained as in the first embodiment.

Figure 6:
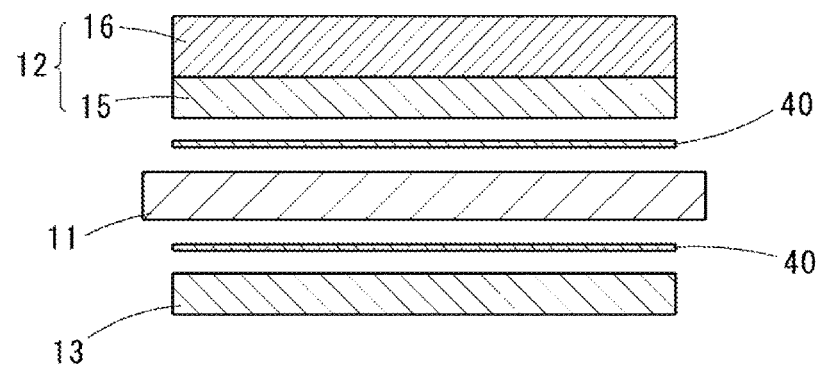
FIG. 6 is a sectional view showing a manufacturing process of a power-module substrate unit according to a fifth embodiment of the present invention.
Figure 6:
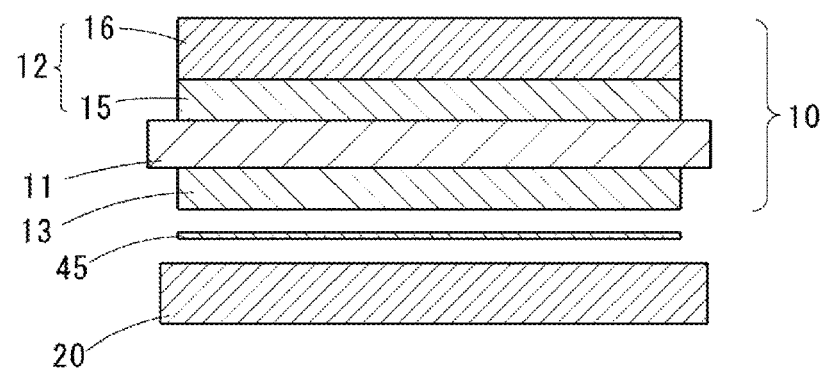
Figure 6:
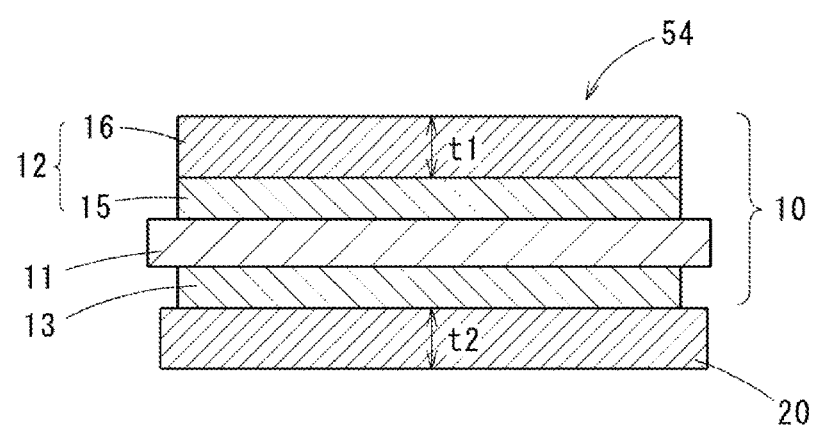

FIG. 6 shows a manufacturing method of a power-module substrate unit 54 of a fifth embodiment. In this power-module substrate unit 54, the circuit layer 12 is made as a clad material in which the first layer 15 and the second layer 16 are bonded in advance.

As shown in a part (a) of FIG. 6, the circuit layer 12 of the clad material is stacked on one surface of the ceramic substrate 11 with the brazing material 40 made of Al—Si based alloy therebetween, and the metal layer 13 is stacked on another surface of the ceramic substrate 11 with the brazing material 40 made of Al—Si based alloy therebetween, and then these members are heated in a state of being pressed under vacuum atmosphere so as to be brazed (a first bonding process). Consequently, the power-module substrate 10 in which the circuit layer 12 and the metal layer 13 are bonded on both the surfaces of the ceramic substrate 11 is manufactured (a part (b) of FIG. 6).

Next, as shown in the part (b) of FIG. 6, the heat sink 20 is stacked on the metal layer 13 of the obtained power-module substrate 10 with the brazing material 45 made of Al—Si—Mg based alloy therebetween, and these members are brazed by heating under non-oxidation atmosphere such as nitrogen atmosphere in a pressed state (a second bonding process).

In this power-module substrate unit 54 shown in a part (c) of FIG. 6, a ratio $(t1 \times A1 \times \sigma1)/(t2 \times A2 \times \sigma2)$ is 0.85 or larger and 1.40 or smaller when t1 is a thickness of the second layer 16 of the circuit layer 12, A1 is a bonding area of the second layer 16 and the first layer 15, σ1 is a yield stress of the second layer 16, t2 is a thickness of the heat sink 20, A2 is a bonding area of the metal layer 13 and the heat sink 20, and σ2 is a yield stress of the heat sink 20.

In this power-module substrate unit 54, as described above, in cases in which the ratio $(t1 \times A1 \times \sigma1)/(t2 \times A2 \times \sigma2)$ is 1.00, 0.85 or larger and smaller than 1.00, or larger than 1.00 and 1.40 or smaller, a good symmetry structure about the ceramic substrate 11 can be obtained as in the first embodiment.

Figure 7:
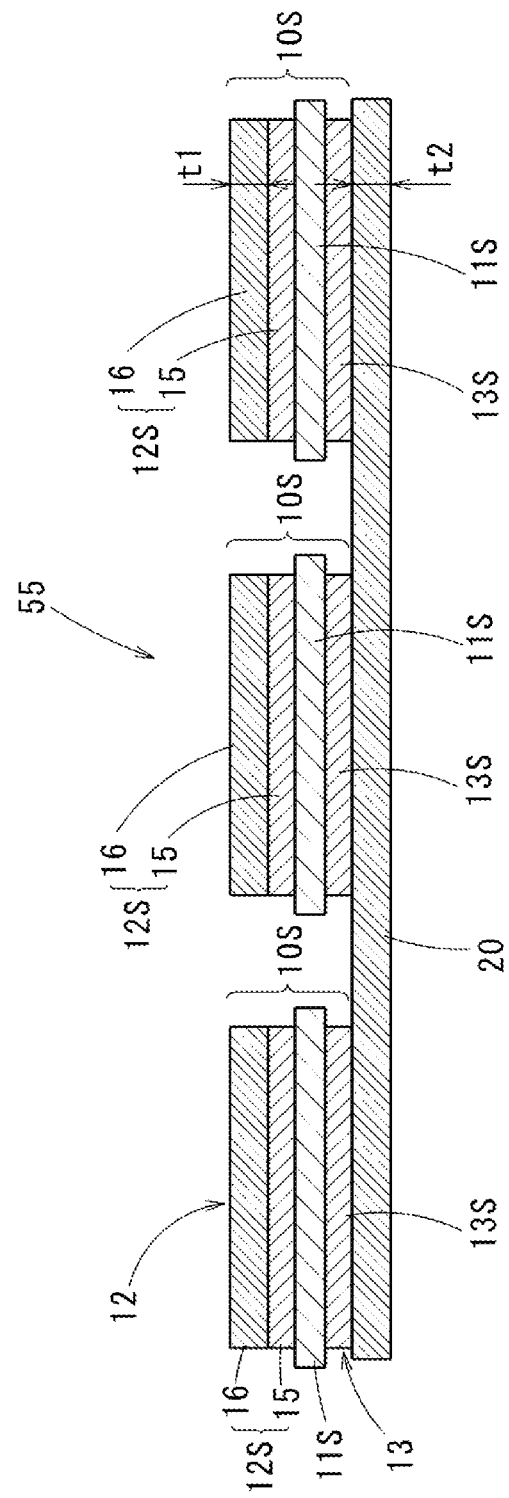
FIG. 7 is a sectional view of a power-module substrate unit according to a sixth embodiment of the present invention.

FIG. 7 shows a power-module substrate unit 55 of a sixth embodiment. In the above first to fifth embodiments, shapes in which one power-module substrate is bonded on one heat sink are described. The present invention can be also applied to a case in which a plurality of power-module substrates 10S are bonded on one heat sink 20 as the power-module substrate unit 55 shown in FIG. 7. In the power-module substrate unit 55 constructed as above, the highly-integrated substrate can be obtained by bonding the plurality of power-module substrates 10S on the heat sink 20 at spaces.

In this power-module substrate unit 55, the power-module substrates 10S each are formed by stacking a small-circuit layer 12S which is formed by stacking the first layer 15 and the second layer 16, a small-ceramic substrate 11S, and a small-metal layer 13S. A ratio $(t1 \times A1 \times \sigma1)/(t2 \times A2 \times \sigma2)$ is 0.85 or larger and 1.40 or smaller where t1 is a thickness of the second layer 16, A1 is a bonding area of the second layer 16 and the first layer 15 (in this case, A1 is a total of the bonding areas of the second layers 16 and the first layers 15 in the small-circuit layers 12S constructing the circuit layer 12), σ1 is a yield stress of the second layer 16, t2 is a thickness of the heat sink 20, A2 is a bonding area of the heat sink 20 and the metal layer 13 constructed from the plurality of small metal layers 13S (in this case, A2 is a total of the bonding areas of the small-metal layers 13S to the heat sink 20), and σ2 is a yield stress of the heat sink 20.

In this power-module substrate unit 55, as described above, in cases in which the ratio (t1×A1×σ1)/(t2×A2×σ2) is 1.00, 0.85 or larger and smaller than 1.00, or larger than 1.00 and 1.40 or smaller, a good symmetry structure about the ceramic substrate 11 can be obtained as in the first embodiment.

In a case in which the plurality of power-module substrates 10S are provided as in the power-module substrate unit 55, in each of bonding parts, by considering symmetry of the rigidity of the second layer 16 (an yield stress considering a volume multiplying the thickness t1 and the bonding area A1) and the rigidity of the heat sink 20, the warp can be reliably prevented from generating.

Figure 8:
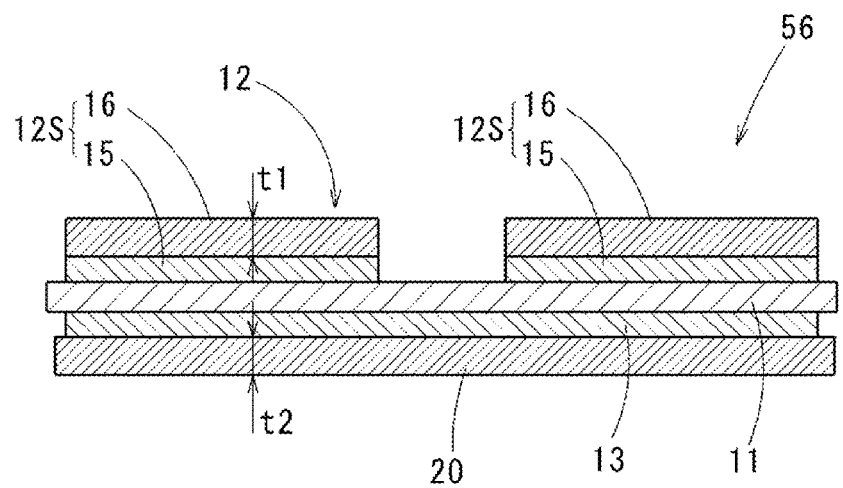
FIG. 8 is a sectional view of a power-module substrate unit according to a seventh embodiment of the present invention.
Figure 9:
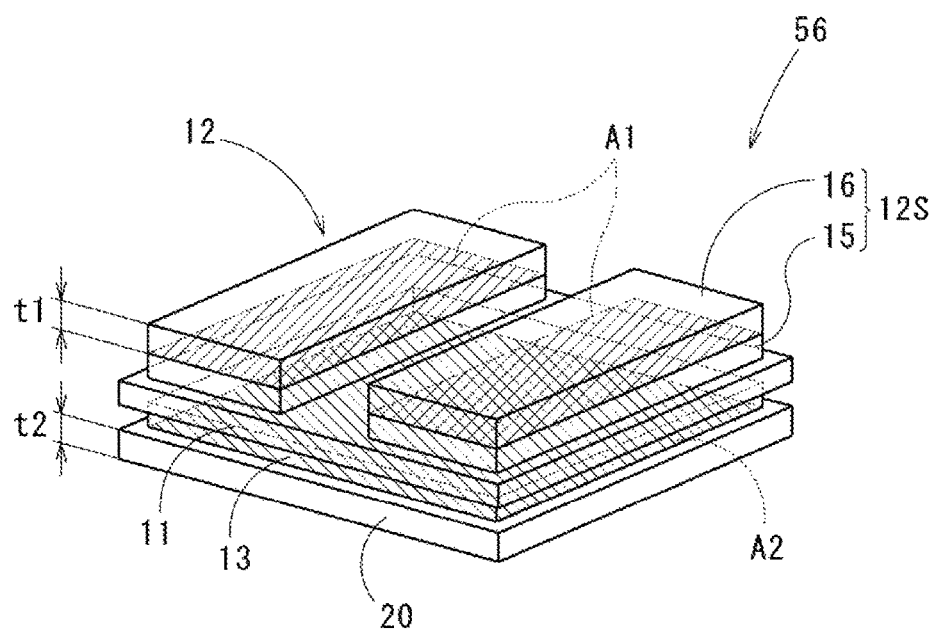
FIG. 9 is a perspective view showing the power-module substrate unit of FIG. 8.

FIG. 8 and FIG. 9 show a power-module substrate unit 56 of a seventh embodiment. In this power-module substrate unit 56, the metal layer 13 and the ceramic substrate 11 are respectively formed from one plate, and the circuit layer 12 is formed from the plurality of small-circuit layers 12S which are arranged on the ceramic substrate 11 with space along a surface direction. Thus, the present invention can be applied also to a case in which the circuit layer 12 is formed from the separated plurality of small-circuit layers 12S. In the power-module substrate unit 56 constructed as above, since a pattern of the circuit layer 12 is formed by bonding the plurality of small-circuit layers 12S with space on the ceramic substrate 11, the highly-integrated substrate can be obtained similarly to the power-module substrate unit 55 of the sixth embodiment.

The small-circuit layers 12S in the power-module substrate 56 are formed respectively by stacking the first layer 15 and the second layer 16. A ratio (t1×A1×σ1)/(t2×A2×σ2) is 0.85 or larger and 1.40 or smaller where t1 is a thickness of the second layer 16, A1 is a bonding area of the second layer 16 and the first layer 15 (in this case, A1 is a total of the bonding areas of the second layers 16 and the first layers 15 in the small-circuit layers 12S constructing the circuit layer 12), σ1 is a yield stress of the second layer 16, t2 is a thickness of the heat sink 20, A2 is a bonding area of the heat sink 20 and the metal layer 13, and σ2 is a yield stress of the heat sink 20.

In this power-module substrate unit 56, as described above, in cases in which the ratio (t1×A1×σ1)/(t2×A2×σ2) is 1.00, 0.85 or larger and smaller than 1.00, or larger than 1.00 and 1.40 or smaller, a good symmetry structure about the ceramic substrate 11 can be obtained as in the first embodiment.

In a case in which the circuit layer 12 is formed from the plurality of small-circuit layers 12S which are separated from each other as in the power-module substrate unit 56, shapes of the circuit layer 12 and the metal layer 13 which are bonded on the ceramic substrate 11 are different though, in bonding parts, by considering symmetry of the rigidity of the second layer 16 (an yield stress considering a volume multiplying the thickness t1 and the bonding area A1) and the rigidity of the heat sink 20 (an yield stress considering a volume multiplying the thickness t2 and the bonding area A2), the warp can be reliably prevented from generating.

EXAMPLES

Next, examples for confirming the effect of the present invention will be explained. For examples 1 to 18 of the present invention, ceramic substrates made of AlN having thickness of 0.635 mm and first layers and metal layers made of 4N—Al having thickness of 0.6 mm were prepared, and second layers of circuit layers and heat sinks having thicknesses, bonding areas, aluminum purities, and yield stresses shown in Table 1 were prepared. The heat sinks were a flat plate shape with a whole plane size of 60 mm×50 mm.

These were bonded by the bonding method described in the first to fifth embodiments, so that power-module substrate units were manufactured. "Embodiment No." (the bonding methods) in Table 1 denotes the manufacturing methods of embodiments by which the samples were manufactured. As a conventional example 1, manufactured was a power-module substrate unit in which a second layer was not formed by not bonding the second layer of the circuit layer in the bonding method described in the first embodiment.

"Ratio" in Table 1 denotes (t1×A1×σ1)/(t2×A2×σ2) where the embodiment No. (the bonding method) was 1 or 5, (t1×A1×σ1+t3×A3×σ3)/(t2×A2×σ2+t4×A4×σ4) where the embodiment No. (the bonding method) was 2, (t1×A1×σ1+t3×A3×σ3)/(t2×A2×σ2) where the embodiment No. (the bonding method) was 3, and (t1×A1×σ1)/(t2×A2×σ2+t4×A4×σ4) where the embodiment No. (the bonding method) was 4.

About the obtained samples, warp size (primary warp) at normal temperature (25° C.) after bonding, and warp size (warp after heating) when heated to 280° C. were measured. The warp sizes were evaluated by fluctuation of flatness at a back surface of the heat sink measured by a moire-type three-dimensional shape measuring device. The warp sizes were positive value (+) when the warp was protruded to the circuit layer side, or were negative value (−) when the warp was dented at the circuit layer side. Table 1 shows the results.

TABLE 1

| SAMPLES | 2nd Layer of Circuit Layer | | | | Heat Sink | | | | Circuit-Side Bonding Core | |
|---|---|---|---|---|---|---|---|---|---|---|
| | Plate Thickness t1 (mm) | Bonding Area A1 (mm²) | Aluminum Purity (mass %) | Yield Stress σ1 (N/mm²) | Plate Thickness t2 (mm) | Bonding Area A2 (mm²) | Aluminum Purity (mass %) | Yield Stress σ2 (N/mm²) | Plate Thickness t3 (mm) | Bonding Area A3 (mm²) |
| EXAMPLE 1 | 1.2 | 1369 | 98.00 | 40 | 0.8 | 1369 | 97.50 | 50 | — | — |
| EXAMPLE 2 | 0.9 | 1369 | 98.00 | 40 | 0.8 | 1369 | 97.50 | 50 | — | — |
| EXAMPLE 3 | 1.4 | 1369 | 98.00 | 40 | 0.8 | 1369 | 97.50 | 50 | — | — |
| EXAMPLE 4 | 1.2 | 1369 | 98.00 | 40 | 0.8 | 1369 | 97.50 | 50 | 0.2 | 1369 |
| EXAMPLE 5 | 1.4 | 1369 | 99.50 | 30 | 0.8 | 1369 | 97.50 | 50 | — | — |
| EXAMPLE 6 | 1.2 | 1225 | 98.00 | 40 | 0.8 | 1369 | 98.00 | 40 | 0.2 | 1225 |
| EXAMPLE 7 | 1.2 | 1156 | 98.00 | 40 | 0.8 | 1369 | 98.00 | 40 | — | — |
| EXAMPLE 8 | 1.0 | 1156 | 99.50 | 30 | 0.8 | 1369 | 99.50 | 30 | — | — |
| EXAMPLE 9 | 1.4 | 900 | 98.00 | 40 | 0.8 | 1369 | 98.00 | 40 | — | — |
| EXAMPLE 10 | 1.4 | 900 | 99.50 | 30 | 0.8 | 1369 | 98.00 | 40 | — | — |
| EXAMPLE 11 | 1.0 | 1156 | 98.00 | 40 | 0.8 | 1369 | 98.00 | 40 | 0.2 | 1156 |

TABLE 1-continued

| SAMPLES | | | | | | | | | |
|---|---|---|---|---|---|---|---|---|---|
| EXAMPLE 12 | 1.1 | 1369 | 98.00 | 40 | 0.8 | 1369 | 98.00 | 40 | — | — |
| EXAMPLE 13 | 1.1 | 1156 | 98.00 | 40 | 0.8 | 1369 | 98.00 | 40 | — | — |
| EXAMPLE 14 | 1.2 | 1225 | 98.00 | 40 | 0.8 | 1369 | 98.00 | 40 | — | — |
| EXAMPLE 15 | 0.7 | 1369 | 98.00 | 40 | 0.8 | 1369 | 97.50 | 50 | — | — |
| EXAMPLE 16 | 1.5 | 1369 | 98.00 | 40 | 0.8 | 1369 | 97.50 | 50 | — | — |
| EXAMPLE 17 | 0.7 | 1369 | 98.00 | 40 | 0.8 | 1369 | 97.50 | 50 | 0.2 | 1369 |
| EXAMPLE 18 | 1.7 | 1369 | 98.00 | 40 | 0.8 | 1369 | 97.50 | 50 | 0.2 | 1369 |
| CONVENTIONAL 1 | — | 1369 | — | — | 3.0 | 1369 | 97.50 | 50 | — | — |

| | Circuit-Side Bonding Core | | Heat Radiation-Side Bonding Core | | | | | | | |
|---|---|---|---|---|---|---|---|---|---|---|
| SAMPLES | Aluminum Purity (mass %) | Yield Stress σ3 (N/mm²) | Plate Thickness t4 (mm) | Bonding Area A4 (mm²) | Aluminum Purity (mass %) | Yield Stress σ4 (N/mm²) | Ratio | Primary Warp (μm) | Warp when Heated (μm) | Embodiment No. |
| EXAMPLE 1 | — | — | — | — | — | — | 1.20 | 45 | −40 | 1 |
| EXAMPLE 2 | — | — | — | — | — | — | 0.90 | 130 | −50 | 1 |
| EXAMPLE 3 | — | — | — | — | — | — | 1.40 | −120 | −110 | 1 |
| EXAMPLE 4 | 98.00 | 40 | 0.2 | 1369 | 98.00 | 40 | 1.17 | 60 | −25 | 2 |
| EXAMPLE 5 | — | — | — | — | — | — | 1.05 | 85 | −125 | 1 |
| EXAMPLE 6 | 98.00 | 40 | 0.2 | 1369 | 98.00 | 40 | 1.25 | −40 | −65 | 2 |
| EXAMPLE 7 | — | — | — | — | — | — | 1.27 | 35 | −55 | 1 |
| EXAMPLE 8 | — | — | — | — | — | — | 1.06 | 100 | −100 | 1 |
| EXAMPLE 9 | — | — | — | — | — | — | 1.15 | 75 | −60 | 1 |
| EXAMPLE 10 | — | — | — | — | — | — | 0.86 | 125 | −85 | 1 |
| EXAMPLE 11 | 98.00 | 40 | — | — | — | — | 1.27 | −50 | −80 | 3 |
| EXAMPLE 12 | — | — | 0.2 | 1369 | 98.00 | 40 | 1.10 | 80 | −65 | 4 |
| EXAMPLE 13 | — | — | 0.2 | 1369 | 98.00 | 40 | 0.93 | 115 | −90 | 4 |
| EXAMPLE 14 | — | — | — | — | — | — | 1.34 | −80 | −125 | 5 |
| EXAMPLE 15 | — | — | — | — | — | — | 0.70 | 200 | −275 | 1 |
| EXAMPLE 16 | — | — | — | — | — | — | 1.50 | −180 | −230 | 1 |
| EXAMPLE 17 | 98.00 | 40 | 0.2 | 1369 | 98.00 | 40 | 0.75 | 155 | −270 | 2 |
| EXAMPLE 18 | 98.00 | 40 | 0.2 | 1369 | 98.00 | 40 | 1.58 | −180 | −250 | 2 |
| CONVENTIONAL 1 | — | — | 0.2 | 1369 | 98.00 | 40 | — | 290 | −500 | — |

As known from Table 1, in the conventional sample 1 in which the second layer made of an aluminum plate having purity lower than 99.90 mass % were not stacked on the circuit layer, it was confirmed that the warp size was bigger at the normal temperature and when heated. On the other hand, in the invention examples 1 to 18 in which the second layer made of an aluminum plate having purity lower than 99.90 mass % were stacked on the circuit layer, it was confirmed that the power-module substrate unit in which the warp size at the normal temperature and when heated was small can be obtained.

Furthermore, it was confirmed that the warp size could be further reduced in the examples 1 to 14 in which (t1×A1× σ1)/(t2×A2×σ2), (t1×A1×σ1+t3×A3×σ3)/(t2×A2×σ2+t4× A4×σ4), or (t1×A1×σ1+t3×A3×σ3)/(t2×A2×σ2), (t1×A1× σ1)/(t2×A2×σ2+t4×A4×σ4) were in a range of 0.85 or larger and 1.40 or smaller. Accordingly, in the power-module substrate unit, the reliability can be held for a long term since the warp can be prevented from generating if it is exposed to high temperature when the semiconductor element is soldered or in the usage environment after that.

The present invention is not limited to the above-described embodiments and various modifications may be made without departing from the scope of the present invention. For example, the heat sinks had the flat plate shape in the above embodiments though, the heat sink may have a shape in which multi-pin fin or belt fin is formed on a flat plate part on which the metal layer is bonded. In this case, the thickness t2 is a thickness of the flat plate part.

INDUSTRIAL APPLICABILITY

It is possible to provide a power-module substrate unit with heat sink and a power module in which not only a warp (a primary warp) is small after bonding a heat sink, but also a warp in a mounting process of semiconductor elements or in an usage environment is small.

REFERENCE SIGNS LIST 10 power-module substrate
11 ceramic substrate
11S small-ceramic substrate
12 circuit layer
12S small-curcuit layer
13 metal layer
13S small-metal layer
13a metal-layer aluminum plate
15 first layer
15a first-layer aluminum
16 second layer
16a second-layer aluminum plate
17 power-module substrate
18 circuit layer
19 clad plate
20 heat sink
30 semiconductor element
40 brazing material
41a circuit-side bonding core
41b heat-radiation-side bonding core
42 brazing material layer
43a, 43b double-side clad brazing material
44 brazing material layer
45 brazing material
50 to 56 power-module substrate unit
60 bonded body
110 pressing device

The invention claimed is:

1. A power-module substrate unit comprising at least one power-module substrate consisting essentially of one ceramic substrate, a circuit layer bonded directly to one surface of the ceramic substrate, and a metal layer bonded directly to another surface of the ceramic substrate; and a heat sink on which the metal layer of the power-module substrate is bonded, wherein:
the metal layer is made of an aluminum plate having purity of 99.99 mass % or higher;
the heat sink is formed from an aluminum plate having purity of 99.90 mass % or lower;
the circuit layer has a two-layer stacking structure of a first layer made of an aluminum plate having the purity of 99.99 mass % or higher and being bonded to the ceramic substrate; and a second layer made of an aluminum plate having the purity lower than 99.90 mass % and being bonded on a surface of the first layer; and wherein
a ratio $(t1 \times A1 \times \sigma1)/(t2 \times A2 \times \sigma2)$ is 0.85 or larger and 1.40 or smaller: wherein
$t1$ (mm) is a thickness of the second layer;
$A1$ (mm$^2$) is a bonding area of the second layer;
$\sigma1$ (N/mm$^2$) is a yield stress of the second layer;
$t2$ (mm) is a thickness of the heat sink;
$A2$ (mm$^2$) is a bonding area of the heat sink; and
$\sigma2$ (N/mm$^2$) is a yield stress of the heat sink.

2. The power-module substrate unit according to claim 1, wherein the circuit layer of the power module substrate is formed of a plurality of small-circuit layers which are separated from each other.

3. The power-module substrate unit according to claim 1 comprising a plurality of the power-module substrates.

4. A power module comprising the power-module substrate unit according to claim 1 and a semiconductor element mounted on a surface of the circuit layer.

5. A power-module substrate unit comprising at least one power-module substrate consisting essentially of one ceramic substrate, a circuit layer bonded directly to one surface of the ceramic substrate, and a metal layer bonded directly to another surface of the ceramic substrate; and a heat sink on which the metal layer of the power-module substrate is bonded, wherein
the circuit layer further comprises a circuit-side bonding core made of an aluminum alloy plate between a first layer and a second layer;
the metal layer is made of an aluminum plate having purity of 99.99 mass % or higher;
the heat sink is formed from an aluminum plate having purity of 99.90 mass % or lower;
the circuit layer has a two-layer stacking structure of the first layer made of an aluminum plate having the purity of 99.99 mass % or higher and being bonded to the ceramic substrate; and the second layer made of an aluminum plate having the purity lower than 99.90 mass % and being bonded on a surface of the first layer, and
a ratio $(t1 \times A1 \times \sigma1 + t3 \times A3 \times \sigma3)/(t2 \times A2 \times \sigma2)$ is 0.85 or larger and 1.40 or smaller: wherein
$t1$ (mm) is a thickness of the second layer;
$A1$ (mm$^2$) is a bonding area of the second layer;
$\sigma1$ (N/mm$^2$) is a yield stress of the second layer;
$t2$ (mm) is a thickness of the heat sink;
$A2$ (mm$^2$) is a bonding area of the heat sink;
$\sigma2$ (N/mm$^2$) is a yield stress of the heat sink;
$t3$ (mm) is a thickness of the circuit-side bonding core;
$A3$ (mm$^2$) is a bonding area of the circuit-side bonding core and the first layer; and
$\sigma3$ (N/mm$^2$) a yield stress of the circuit-side bonding core.

6. The power-module substrate unit according to claim 5, wherein the circuit layer of the power module substrate is formed of a plurality of small-circuit layers which are separated from each other.

7. The power-module substrate unit according to claim 5 comprising a plurality of the power-module substrates.

8. A power module comprising the power-module substrate unit according to claim 5 and a semiconductor element mounted on a surface of the circuit layer.

9. A power-module substrate unit comprising at least one power-module substrate consisting essentially of one ceramic substrate, a circuit layer bonded directly to one surface of the ceramic substrate, and a metal layer bonded directly to another surface of the ceramic substrate; and a heat sink on which the metal layer of the power-module substrate is bonded, wherein
a heat radiation-side bonding core made of an aluminum alloy plate is further provided between the metal layer and the heat sink,
the metal layer is made of an aluminum plate having purity of 99.99 mass % or higher;
the heat sink is formed from an aluminum plate having purity of 99.90 mass % or lower;
the circuit layer has a two-layer stacking structure of a first layer made of an aluminum plate having the purity of 99.99 mass % or higher and being bonded to the ceramic substrate; and a second layer made of an aluminum plate having the purity lower than 99.90 mass % and being bonded on a surface of the first layer, and
a ratio $(t1 \times A1 \times \sigma1)/(t2 \times A2 \times \sigma2 + t4 \times A4 \times \sigma4)$ is 0.85 or larger and 1.40 or smaller, wherein:
$t1$ (mm) is a thickness of the second layer;
$A1$ (mm$^2$) is a bonding area of the second layer;
$\sigma1$ (N/mm$^2$) is a yield stress of the second layer;
$t2$ (mm) is a thickness of the heat sink;
$A2$ (mm$^2$) is a bonding area of the heat sink;
$\sigma2$ (N/mm$^2$) is a yield stress of the heat sink;
$t4$ (mm) is a thickness of the heat radiation-side bonding core;
$A4$ (mm$^2$) is a bonding area of the heat radiation-side bonding core and the metal layer; and
$\sigma4$ (N/mm$^2$) is a yield stress of the heat radiation-side bonding core.

10. The power-module substrate unit according to claim 9, wherein the circuit layer of the power module substrate is formed of a plurality of small-circuit layers which are separated from each other.

11. The power-module substrate unit according to claim 9 comprising a plurality of the power-module substrates.

12. A power module comprising the power-module substrate unit according to claim 9 and a semiconductor element mounted on a surface of the circuit layer.

13. A power-module substrate unit comprising at least one power-module substrate consisitng essentially of one ceramic substrate, a circuit layer bonded directly to one surface of the ceramic substrate, and a metal layer bonded directly to another surface of the ceramic substrate; and a heat sink on which the metal layer of the power-module substrate is bonded, wherein
the circuit layer further comprises a circuit-side bonding core made of an aluminum alloy plate between a first layer and a second layer, and a heat radiation-side bonding core made of an aluminum alloy plate between the metal layer and the heat sink, the metal layer is made of an aluminum plate having purity of 99.99 mass % or higher;

the heat sink is formed from an aluminum plate having purity of 99.90 mass % or lower;

the circuit layer has a two-layer stacking structure of the first layer made of an aluminum plate having the purity of 99.99 mass % or higher and being bonded to the ceramic substrate; and the second layer made of an aluminum plate having the purity lower than 99.90 mass % and being bonded on a surface of the first layer, and a ratio $(t1 \times A1 \times \sigma1 + t3 \times A3 \times \sigma3)/(t2 \times A2 \times \sigma2 + t4 \times A4 \times \sigma4)$ is 0.85 or larger and 1.40 or smaller, wherein:

$t1$ (mm) is a thickness of the second layer;

$A1$ (mm$^2$) is a bonding area of the second layer;

$\sigma1$ (N/mm$^2$) is a yield stress of the second layer;

$t2$ (mm) is a thickness of the heat sink;

$A2$ (mm$^2$) is a bonding area of the heat sink;

$\sigma2$ (N/mm$^2$) is a yield stress of the heat sink;

$t3$ (mm) is a thickness of the circuit-side bonding core;

$A3$ (mm$^2$) is a bonding area of the circuit-side bonding core and the first layer;

$\sigma3$ (N/mm$^2$) is a yield stress of the circuit-side bonding core;

$t4$ (mm) is a thickness of the heat radiation-side bonding core;

$A4$ (mm$^2$) is a bonding area of the heat radiation-side bonding core and the metal layer; and $\sigma4$ (N/mm$^2$) is a yield stress of the heat radiation-side bonding core.

14. The power-module substrate unit according to claim 13, wherein the circuit layer of the power module substrate is formed of a plurality of small-circuit layers which are separated from each other.

15. The power-module substrate unit according to claim 13 comprising a plurality of the power-module substrates.

16. A power module comprising the power-module substrate unit according to claim 13 and a semiconductor element mounted on a surface of the circuit layer.

* * * * *